United States Patent
Hynes et al.

(10) Patent No.: US 7,986,027 B2
(45) Date of Patent: Jul. 26, 2011

(54) ENCAPSULATED METAL RESISTOR

(75) Inventors: Eamon Hynes, Limerick (IE); William A. Lane, Waterfall (IE); Bernard Stenson, Manister (IE)

(73) Assignee: Analog Devices, Inc., Norwood, MA (US)

( * ) Notice: Subject to any disclaimer, the term of this patent is extended or adjusted under 35 U.S.C. 154(b) by 1314 days.

(21) Appl. No.: 11/584,117

(22) Filed: Oct. 20, 2006

(65) Prior Publication Data

US 2008/0094168 A1    Apr. 24, 2008

(51) Int. Cl.
*H01L 21/20* (2006.01)
(52) U.S. Cl. ............... 257/536; 257/537; 257/E21.011
(58) Field of Classification Search .......... 257/536, 257/528, 537, E21.011, E21.598; 438/127, 438/384, 329, 382
See application file for complete search history.

(56) References Cited

U.S. PATENT DOCUMENTS

| | | | |
|---|---|---|---|
| 5,034,608 A | 7/1991 | Tavrow et al. | |
| 6,297,556 B1 * | 10/2001 | Heger et al. | 257/766 |
| 6,486,051 B1 | 11/2002 | Sabin et al. | |
| 7,087,522 B2 * | 8/2006 | Nguyen | 438/654 |
| 2004/0262709 A1 | 12/2004 | Yamashita et al. | |
| 2005/0260822 A1 | 11/2005 | Keum et al. | |
| 2006/0091300 A1 | 5/2006 | Nishimura | |
| 2006/0163453 A1 | 7/2006 | Hynes et al. | |
| 2007/0138395 A1 | 6/2007 | Lane et al. | |
| 2008/0061237 A1 | 3/2008 | Franz et al. | |

FOREIGN PATENT DOCUMENTS

| | | |
|---|---|---|
| EP | 0646972 A2 | 4/1995 |
| JP | 07092026 | 4/1995 |
| JP | 08145787 | 6/1996 |
| JP | 08261835 | 10/1996 |
| WO | WO 01/06547 | 1/2001 |

OTHER PUBLICATIONS

PCT/EP2007/061100, International search report and written opinion, Feb. 2, 2008.
International Search Report and Written Opinion from corresponding International application No. PCT/EP2009/051506 mailed Jul. 6, 2009.

* cited by examiner

*Primary Examiner* — Roy K Potter
(74) *Attorney, Agent, or Firm* — Knobbe Martens Olson & Bear LLP (57) ABSTRACT

The method provides a semiconductor structure and method for forming such a structure that provides for protection for resistive layers formed within the structure from contamination from adjacent layers. By encapsulating the resistive layer in a material that is resistant to the diffusion of contaminants it is possible to protect the resistive material during the processing required to manufacture the structure.

22 Claims, 6 Drawing Sheets

ENCAPSULATED METAL RESISTOR

FIELD OF THE INVENTION

The present invention relates to semiconductor fabrication techniques and in particular to the fabrication of metal resistors for use in an integrated circuit. The invention more particularly relates to metal resistors provided in a sandwich arrangement where outer layers are used to protect the resistor.

BACKGROUND

There are many situations in integrated circuit (IC) processing where resistors of different values are required for various circuit functions. In particular, the measurement of temperature requires resistors with relatively high temperature coefficient of resistance (TCR) and low noise. While metal films do not have the highest TCR, they do have very low intrinsic noise, and thus can be used advantageously in the measurement of small temperature changes. One particular application is in the detection of infrared radiation using micro-electro-mechanical (MEMS) type structures and bolometric measurements or calorimetric measurement using MEMS type structures.

A problem with the use of such metal film resistors arises during the fabrication process for forming such resistors in the IC. In such fabrication and other compatible processes the thin films of metal—such as titanium, Ti— exhibit a degradation of their TCR characteristics on exposure to the high temperatures that are encountered during these processes. Conventionally formed as thin films (typically 100-1000 nm), the metal films show initial good TCR levels (about 0.25-0.35% $C^{-1}$) when first deposited but suffers degradation during the subsequent processing to levels that are often not suitable for the intended application. There are several considered reasons as to why this may occur including theories based on micro-structural changes (grain size and growth) which may affect the TCR and also that an incorporation of oxygen and/or nitrogen into the formed metal film may influence the observed TCR. The growth of the micro-crystallites is dependent on:
a) the underlying "bed" material, specifically its smoothness,
b) high temperature processing steps post deposition of the metal layer that can directly impact grain growth,
c) contaminant species such as nitrogen or oxygen, argon or other doping materials.

Figure 1:
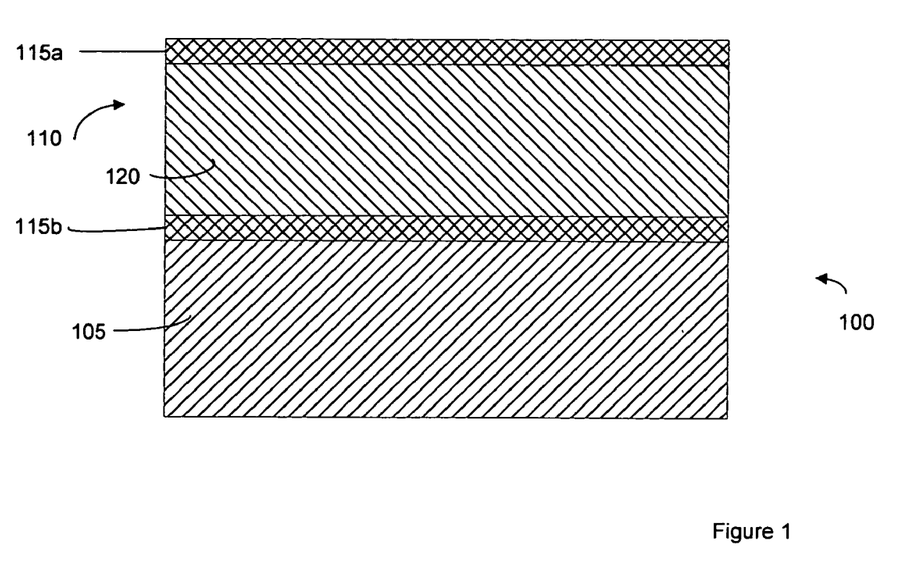
FIG. 1 is a cross section through a known metal film.

The contaminant species impact grain growth by usually clustering to the grain boundaries and changing the energy required to allow grain growth. They also have different carrier transport properties thus can give rise to changes in the resistive properties of the material and subsequently the TCR. The film thickness itself is well known to have an affect on the overall resistive properties. FIG. 1 shows, in simplified form, a typical cross section through a multilayer semiconductor structure 100. The structure includes a base substrate material 105 (which may have formed therein a plurality of electrical elements such as transistors etc and which may have one or more metal layers). A resistive element is formed from a thin film of resistive material 110. On application of the metal film to the substrate, upper and lower surfaces 115a, 115b are identifiable, the surfaces having enhanced carrier scattering properties. Formed between the two surfaces, a bulk region 120 of the metal film has properties based on the presence of bulk crystallites and grain boundaries within the film. The resistivity and TCR are controlled by the relative amounts of the carrier transport through the bulk crystallites, across the grain boundaries and in relation to the film surface that has a modified construction mechanism.

Figure 2:
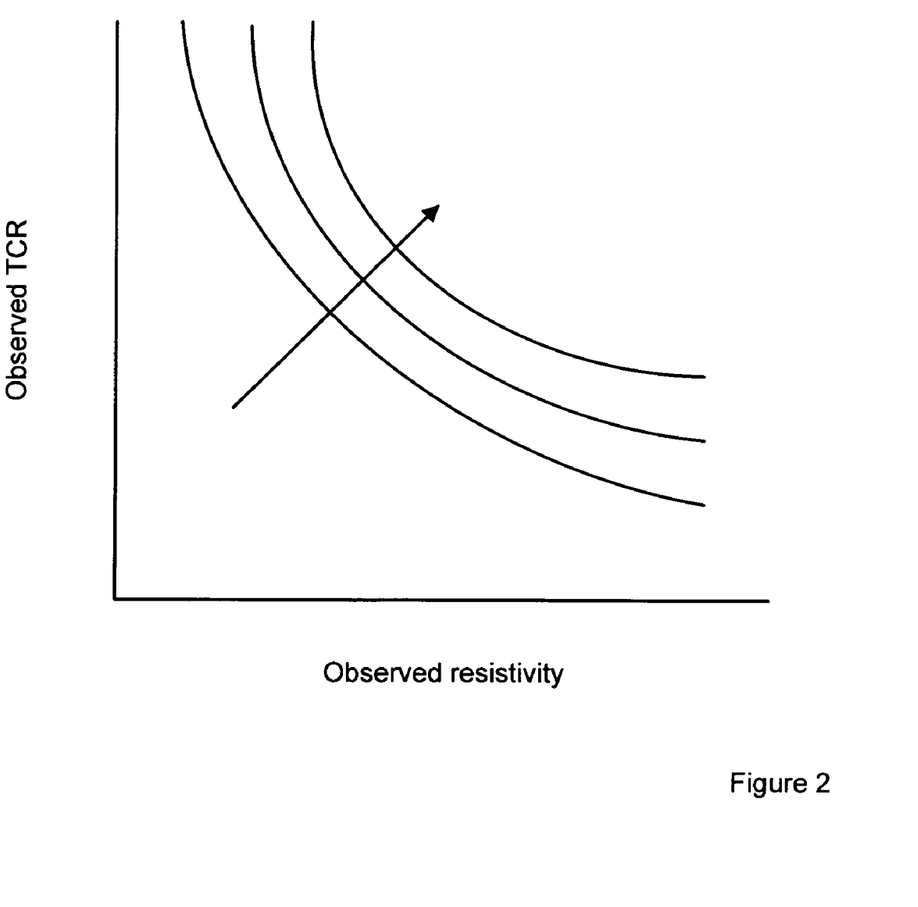
FIG. 2 is a graph showing in schematic form the relationship between observed TCR and resistivity of a deposited metal film with variations in deposition and substrate conditions.

As shown in FIG. 2 there are observed relationships between TCR and resistivity caused by varying the carrier transport between the surface and the bulk and with different deposition conditions. Deposition conditions such as the type of sputtering gas used, chamber pressure and temperature all will affect in determining the overall characteristics of the formed film. If methods other than sputtering are employed—such as evaporation, chemical vapour deposition etc.—then these too may affect the overall properties of the formed film.

It will therefore be appreciated that there a number of problems associated with forming metal films within semiconductor processes specifically associated with the affect that the processing conditions and environment have on the final properties of the film. A solution would be to apply the metal film as a final layer within the process, thereby minimising its exposure to high temperatures etc. This however is not always a feasible solution as many applications require the metal films to be applied as an intermediary layer. There is therefore a need to provide for the fabrication of metal films resistors in a manner that does not result in a degradation of their TCR or resistive characteristics.

SUMMARY

These and other problems are addressed by a process in accordance with the teaching of the invention that provides for the provision of a metal film resistive layer as an intermediary layer within an integrated circuit, the metal film layer being encapsulated during the process within a protective film or barrier.

The barrier serves to protect the resistive layer from contamination resulting from a diffusion of contaminant materials from neighbouring layer, typically during the fabrication process.

The invention also provides an integrated circuit having a multiple layers, the circuit including a metal resistor layer provided as an intermediary layer between others or the multiple layers, the metal resistor being bounded by a protective barrier layer.

Within the context of the present invention it is also taught how to provide such a multilayer structure within a thermally isolated region on a substrate such that the response of the metal film resistor is not affected by thermal effects within the substrate.

These and other features of the invention will be understood with reference to the following drawings.

BRIEF DESCRIPTION OF THE DRAWINGS

The present invention will now be described with reference to the accompanying drawings in which.

DETAILED DESCRIPTION OF THE DRAWINGS

The teaching of the invention will now be explained with reference to FIGS. 3 to 6 which are provided for explanation purposes. It is not intended that the invention be limited in any way except as may be deemed necessary in the light of the appended claims.

Figure 3:
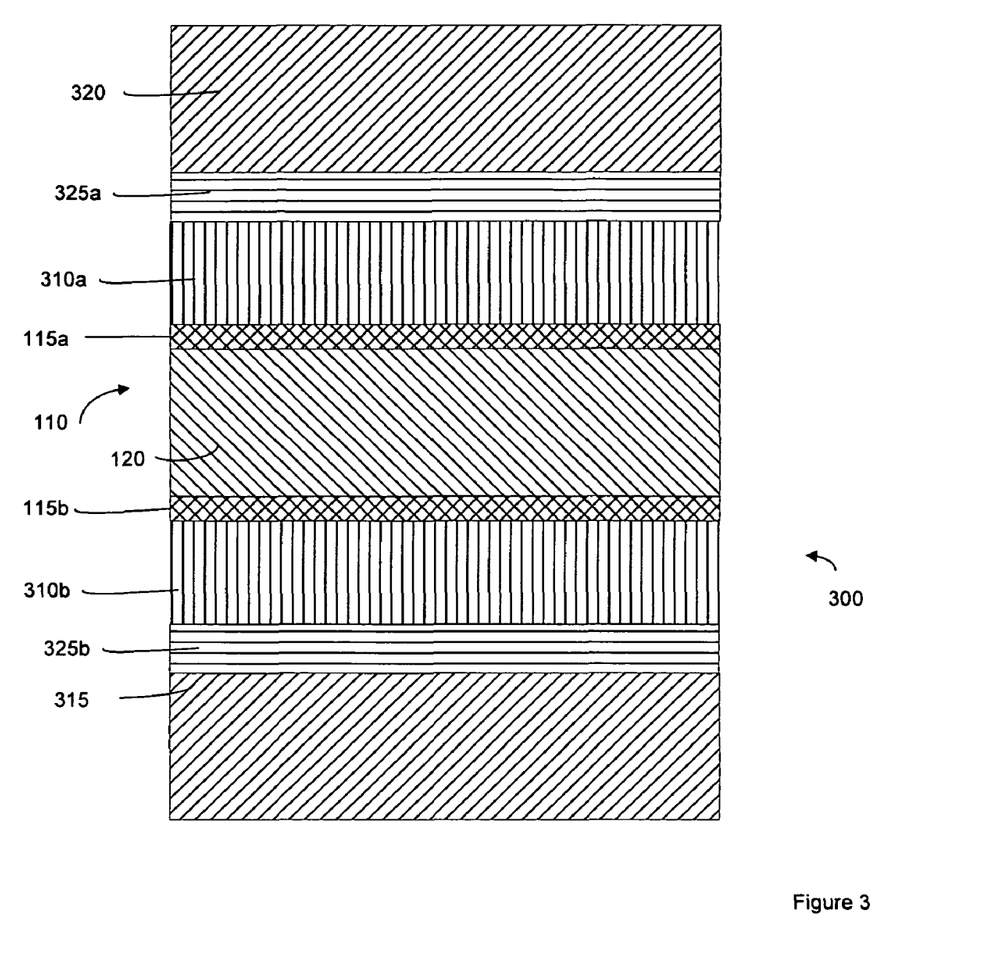
FIG. 3 is a schematic showing a semiconductor stack formed in accordance with the teaching of the invention.

As shown in FIG. 3 a multi-layer semiconductor structure 300 in accordance with the teaching of the invention includes a plurality of layers 305 or levels. Where elements have been described with reference to FIG. 1, the same reference numerals will be used. Specific layers are used for different purposes such as conductive layers or insulating layers, as will be appreciated by the person skilled in the art. Within the context of the present invention as part of the fabrication process for such a multi-layer structure a resistive layer 110 formed from a bulk material 115 bounded above and below by a surface 115a, 115b, is formed as an intermediary layer within the structure. The resistive layer 110 is bounded above and below by a barrier layer 310a, 310b, and collectively the three layers form a stack arrangement. The barrier layer serves to encapsulate the resistive layer 110 and is preferably formed of a material which is resistant to the diffusion of oxygen or other contaminants from the neighbouring layers. A typical metal chosen for the resistive layer is titanium (Ti) and it is found that a suitable barrier material is titanium nitride (TiN). TiN is a known as a semiconductor compatible film and as part of this process is converted into a dense ceramic like film that is resistant to the diffusion of other materials. Although it is obviously a source of nitrogen within the stack, it is found that the presence of the nitrogen is less detrimental to the performance of the resistive layer than for example the diffusion of oxygen into contact with the Ti metal layer. TiN is particularly effective for blocking the diffusion of oxygen.

Within the multilayer structure 300, two or more metal interconnect layers are typically provided, shown in FIG. 3 as a first metal layer 315 and a second metal layer 320. The metal layers are located below and above the resistive stack arrangement respectively and are insulated from the stack by providing inter-metal dielectric layers 325a, 325b.

Figure 4:
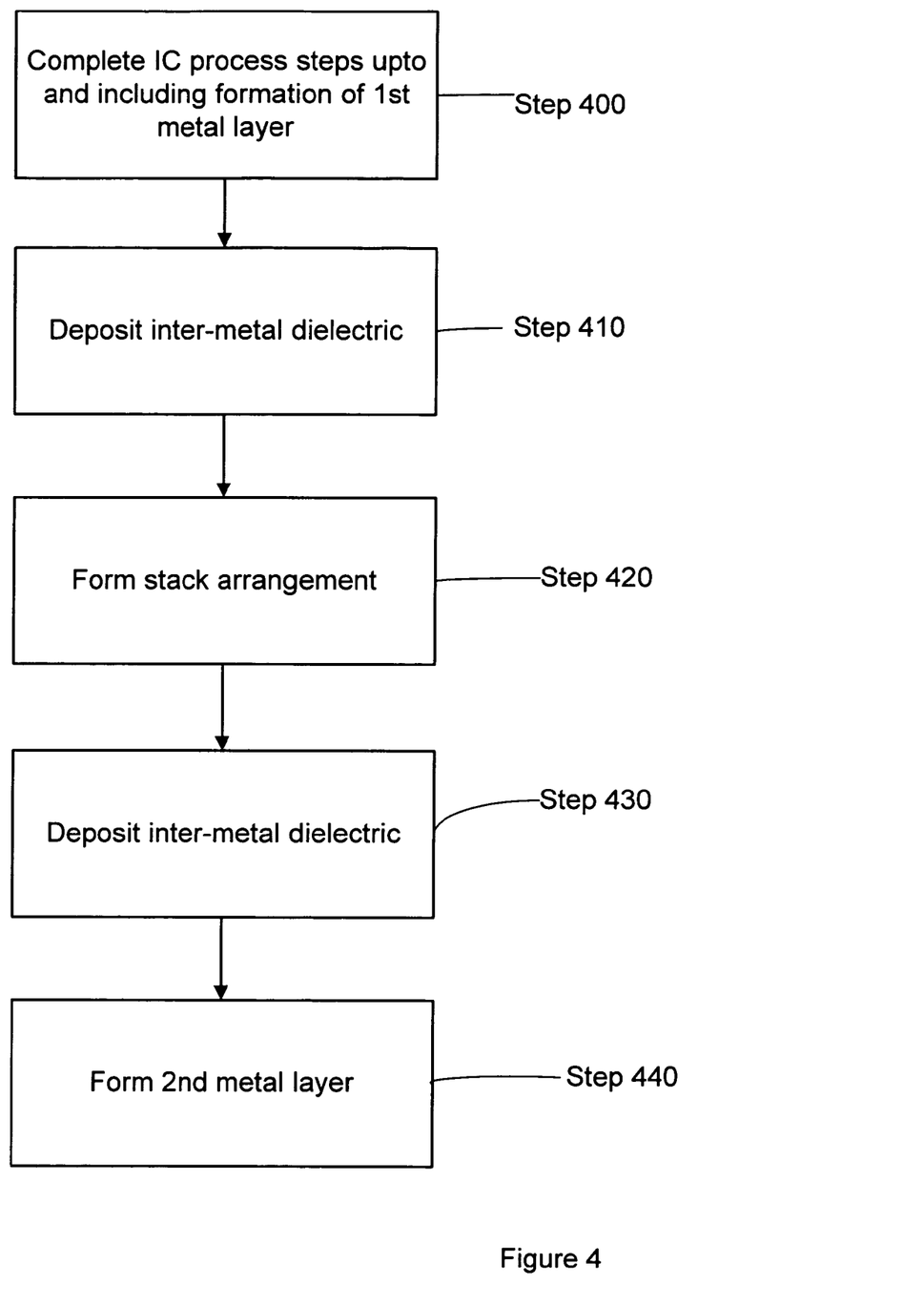
FIG. 4 shows one example of a process flow according to the teaching of the invention.

When forming the structure according to the teaching of the invention desirably, as shown in FIG. 4, conventional integrated circuit processing steps are completed up to the formation of the first metal layer (Step 400). An inter-metal dielectric, such as a layer of about 1 micron of a variety of chemically vapour deposited (CVD) silicon dioxides are provided above the first metal layer (Step 410). The stack arrangement is then formed using a sputtering technique (Step 420). A second inter-metal dielectric layer (Step 430) and a second metal layer (Step 440) are then provided above the stack arrangement.

Using the teaching of the invention it has been observed that with an appropriate choice of TiN material thickness and deposition conditions that it is possible to ensure that the Ti resistor TCR characteristics stay above 0.25% $C^{-1}$ even after heat cycles of about 460° C. for 10 minutes. Thicker Ti films will serve to improve the resilience of the film to heat exposure but there is a cost in the overall sheet resistance being reduced, as the conductivity of the interior material is generally considered better than that of the surface layers.

While FIGS. 3 and 4 have been used to illustrate in generality the arrangement of a metal restive layer with barrier layers located above and below, it is usual that such fabrication will only be a small part of the overall fabrication processing steps. The following examples are illustrative of the fact that depending on the specifics of the desired application, differing combinations of steps will be employed. Where process steps employed are of the conventional and well known variety they are not discussed in detail but the specifics will be well known to the person skilled in the art. While the metal film layers may be referenced as being an intermediary layer within the context of a larger stack arrangement it will be understood that such an intermediary layer may be considered as forming whole or part of an entire layer within the stack.

1/Formation of TiN/Ti/TiN Stack

| Step | Comments |
|---|---|
| Main IC process steps up to and including Metal 1 | Completes all transistors, etc. up to formation of metal interconnect |
| Deposit inter metal dielectric (IMD-1) | Typically ~1 μm of a variety of CVD silicon dioxides |
| RF Sputter | Smoothens region where resistors will be formed |
| Sputter TiN/Ti/TiN stack | Typically 25 nm/150 nm/25 nm |
| Photo mask resistor | Defines shape of resistor |
| Etch Resistor | Defines shape of resistor |
| Deposit Resistor cap dielectric | Typically 100-200 nm, provides insulation between resistor and Metal 2 |
| Photo mask Via 1 | Creates via holes in the Resistor cap layer and the underlying IMD-1 to allow Metal 1 to Metal 2 interconnection. |
| Etch Via 1 | Typically an RIE etch penetrating these dielectric layers. It must have high selectivity to TiN and Ti so the etch will not penetrate these layers during the extended time required to etch the underlying IMD-1. |
| Sputter Metal 2 | Typically 400 nm of various Aluminium alloys |
| Photo mask Metal 2 | Etc. |

While the steps outlined above may be practical in many instances, the resultant structure has a high selectivity to TiN. There are a number of possible alternatives that may be employed including those as follows:

2/Move Ti Stack Downwards to Reduce VIA Over-Etch Time.

| Step | Comments |
|---|---|
| Main IC process steps up to and including Metal 1 | Completes all transistors, etc. up to formation of metal interconnect |
| Deposit 100-200 nm bed oxide | Insulates subsequent Ti stack from M1 |
| RF Sputter | Smoothens region where resistors will be formed |
| Sputter TiN/Ti/TiN stack | Typically 25 nm/150 nm/25 nm |
| Photo mask resistor | Defines shape of resistor |
| Etch Resistor | Defines shape of resistor |
| Deposit IMD-1 | Typically ~1 μm of a variety of CVD silicon dioxides |
| Photo mask Via 1 | Creates via holes in the Resistor cap layer and the underlying IMD-1 to allow Metal 1 to Metal 2 interconnection. |
| Etch Via 1 | Typically an RIE etch penetrating these dielectric layers. As most of the etching is done before hitting the Ti stack the selectivity requirement is lower. |
| Sputter Metal 2 | Typically 400 nm of various Aluminium alloys |
| Photo mask Metal 2 | Etc. |

It is often difficult to guarantee adequate selectivity to Ti compounds as they have high volatility in etch atmospheres so the following sequence is also useful at the cost of another masking step.

3/Separate Via Etch for Resistors from Main via Etch

| Step | Comments |
|---|---|
| Main IC process steps up to and including Metal 1 | Completes all transistors, etc. up to formation of metal interconnect |
| Deposit inter metal dielectric (IMD-1) | Typically ~1 µm of a variety of CVD silicon dioxides |
| RF Sputter | Smoothens region where resistors will be formed |
| Sputter TiN/Ti/TiN stack | Typically 25 nm/150 nm/25 nm |
| Photo mask resistor | Defines shape of resistor |
| Etch Resistor | " |
| Deposit Resistor cap dielectric | Typically 100-200 nm, provides insulation between resistor and Metal 2 |
| Photo mask Via 1a | Creates via holes only in the Resistor cap layer |
| Etch Via 1a | Typically an RIE etch penetrating these dielectric layers. Selectivity requirements are very relaxed as the etch can be set-up to stop more or less as soon as the TiN top layer is encountered. |
| Photo mask Via 1b | Creates holes only in the IMD-1 layer to allow Metal 1 to Metal 2 interconnection. |
| Etch Via 1b | Slight increase in etch time required to overcome added Resistor cap thickness. |
| Sputter Metal 2 | Typically 400 nm of various Aluminium alloys |
| Photo mask Metal 2 | Etc. |

4/ Another version arises if there is still too much ingress of oxygen or nitrogen at the sidewalls of the stack. The schemes presented above leave the Ti sidewall exposed during the subsequent processing. Nitrogen or oxygen may penetrate the film sufficiently to impact the resistivity and TCR. In this situation it is possible to deposit and pattern the stack in two steps as shown below.

| Step | Comments |
|---|---|
| Main IC process steps up to and including Metal 1 | Completes all transistors, etc. up to formation of metal interconnect |
| Deposit inter metal dielectric (IMD-1) | Typically ~1 µm of a variety of CVD silicon dioxides |
| RF Sputter | Smoothens region where resistors will be formed |
| Sputter TiN/Ti only | Typically 25 nm/150 nm |
| Photo mask resistor | Defines shape of resistor |
| Etch Resistor | Defines shape of resistor |
| Sputter TiN top cap | Typically 25 nm to seal top and edges of Ti film |
| Photo mask TiN top cap | Overlay requirement around TiN/Ti main track |
| Etch TiN top cap | |
| Deposit Resistor cap dielectric | Typically 100-200 nm, provides insulation between resistor and Metal 2 |
| Photo mask Via 1 | Creates via holes in the Resistor cap layer and the underlying IMD-1 to allow Metal 1 to Metal 2 interconnection. |
| Etch Via 1 | Typically an RIE etch penetrating these dielectric layers. It must have high selectivity to TiN and Ti so the etch will not penetrate these layers during the extended time required to etch the underlying IMD-1. |
| Sputter Metal 2 | Typically 400 nm of various Aluminium alloys |
| Photo mask Metal 2 | Etc. |

Clearly this method has the disadvantage of increased complexity and the resistor width has increased due to the overlapping cap and its overlay tolerance to the Ti line beneath it. However it is particularly useful for high sensitivity applications where there is a possibility of contaminant ingress through the side walls and it is important that this be minimised.

Figure 5:
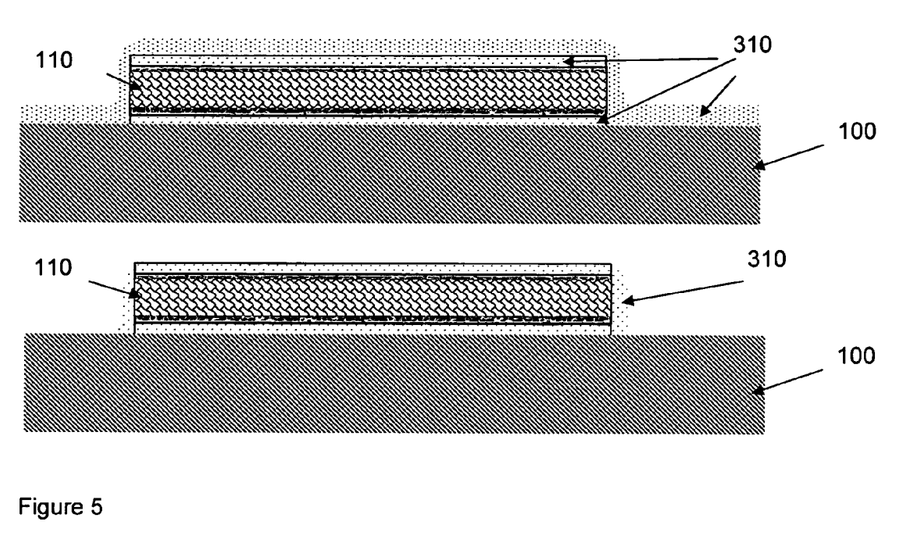
FIG. 5 shows an example of a dual deposition technique that may be employed to provide side fillets of the barrier material with FIG. 5a showing the stack with the deposition layers provided and FIG. 5b the same stack after a first etch back process.

5/Another important variation can be defined, an example of which is shown in FIG. 5 in which the top TiN layer is deposited in two stages with an etch back in between to define a sidewall protection layer which will restrict contaminants from diffusing into the resistor from the side while still allowing narrow lines and spaces with no additional spacing for misalignment needed.

| Step | Comments |
|---|---|
| Main IC process steps up to and including Metal 1 | Completes all transistors, etc. up to formation of metal interconnect |
| Deposit inter metal dielectric (IMD-1) | Typically ~1 µm of a variety of CVD silicon dioxides |
| RF Sputter | Smoothens region where resistors will be formed |
| Sputter TiN/TiTiN | Typically 25 nm/150 nm/35 nm (note increased top TiN layer thickness to allow for later over etch; this top TiN layer must be deposited so that there is good coverage of the previously etched and exposed TiN/Ti/TiN sidewall. |
| Photo mask resistor | Defines shape of resistor |
| Etch Resistor | Defines shape of resistor |
| Sputter TiN top cap | Typically 25 nm to seal top and edges of Ti film |
| Etch back TiN top layer in directional etch (e.g. RIE) | Stop when underlying IMD surface is exposed leaving sidewall protection layer of TiN. |
| Deposit Resistor cap dielectric | Typically 100-200 nm, provides insulation between resistor and Metal 2 |
| Photo mask Via 1 | Creates via holes in the Resistor cap layer and the underlying IMD-1 to allow Metal 1 to Metal 2 interconnection. |
| Etch Via 1 | Typically an RIE etch penetrating these dielectric layers. It must have high selectivity to TiN and Ti so the etch will not penetrate these layers during the extended time required to etch the underlying IMD-1. |
| Sputter Metal 2 | Typically 400 nm of various Aluminium alloys |
| Photo mask Metal 2 | Etc. |

Other variations and sequences are possible if the resistor is to be located elsewhere in the metal interconnection stack or if there are via plugs used in the process. However it will be understood that the overall plan is the same.

The use of TiN as a semiconductor compatible film is recognised and the present inventors have taken advantage of the properties of the TiN, which is converted into a dense ceramic-like film which is relatively resistant to the diffusion of other materials, to provide a protective barrier adjacent to the resistive material which is chosen in this exemplary arrangement to be Ti. While TiN is obviously a heavy source of nitrogen in the stack of materials this seems to be of less importance than its ability to exclude other materials such as oxygen. It will be understood however that the TiN/Ti stack that is described is purely exemplary of the type of barrier arrangement that could be used within the context of the teaching of the invention and that other barrier materials may offer similar or improved performance.

In accordance with the teaching of the invention it is found that with appropriate choice of the TiN (or other barrier material) thickness and deposition conditions we can ensure that the Ti resistor TCR stays above 0.25%/C even after heat cycles of 460 C. for 10 minutes. Thicker Ti films improve the resilience of the film to heat exposure but at a cost of reducing the sheet resistance.

The provision of a stack arrangement in accordance with the teaching of the invention is advantageous for a number of applications but specifically for applications where the small changes in the resistance of the formed resistors are indicative of actual measurements that require sensing. A resistor formed with barrier layers according to the teaching of the invention has improved sensitivity to incident signals and can therefore be used in environments where such sensitivity is required. As such it will be appreciated that the resistors formed using the teaching of the invention using metal films are configured to have high resistivity such that they are sensitive to small changes in an incident signal. Such a signal will typically be provided by irradiation of the resistor, with the output of the resistor being indicative of changes in the thermal radiation incident on the resistor.

One such application or environment is in thermally sensitive environments where the overall signal output of the resistive material is based on a temperature fluctuation. In such applications it is known to use the thermal properties of the resistive material as an indicator of a change in the environment being sensed. With improvements offered in the response characteristics of the resistive material it is important that the response provided in not based on a spurious signal arising from the actual substrate in which the resistor is embedded. The present invention addresses this problem by providing the resistive stack in a substrate region that is thermally isolated from the remaining portions of the substrate.

Figure 6A:
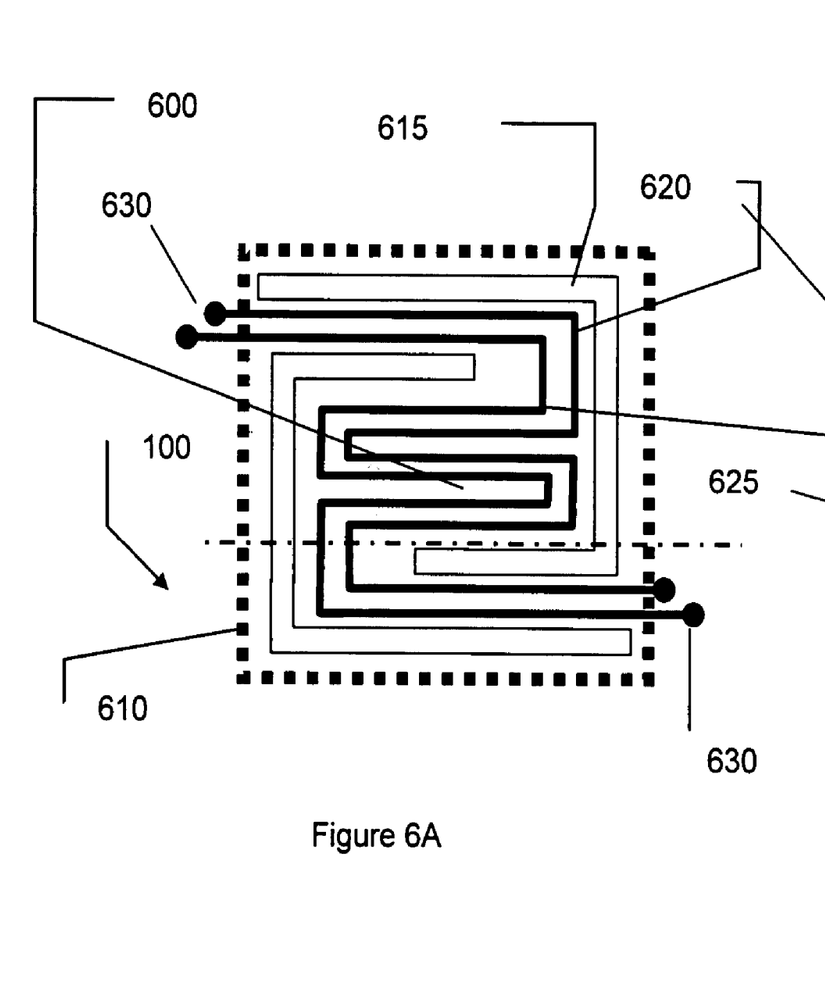
FIG. 6 shows how a stack may be formed on a thermally isolated region within the substrate according to the teaching of the invention.
Figure 6B:
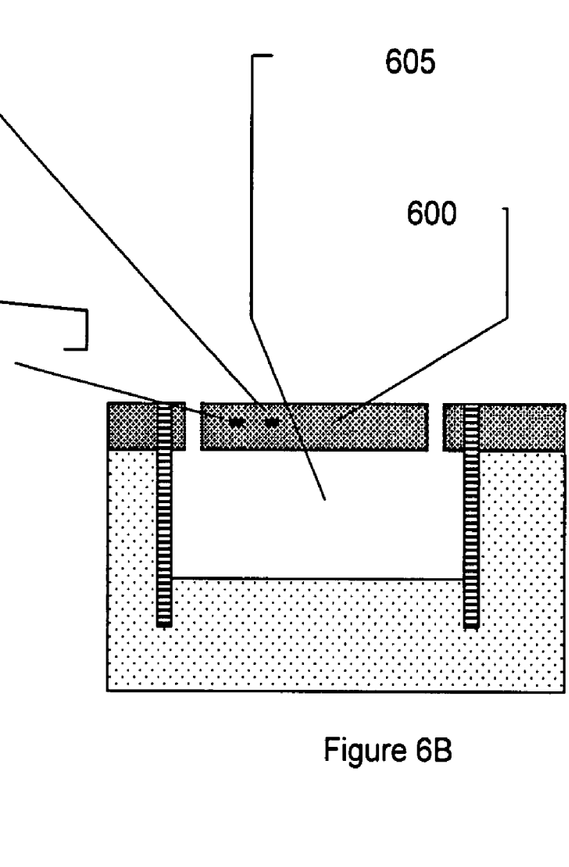

FIG. 6 shows an example of such a structure. In FIG. 6a a plan view of a substrate including two resistors formed in accordance with the teaching of the invention is shown while FIG. 6b shows a sectional view.

As shown in the views of FIG. 6 one way to provide for thermal isolation between the resistive stack structure and remaining portions of the electrical circuit with which it is coupled is to provide a thermally isolated table 610 which is formed by etching a cavity 605 in the silicon substrate 105. The extent of the cavity may be defined by the use of trenches 611 which can control the extent of the etch process. The cavity serves to insulate the table 610 from the substrate below. Slots 615 can be provided to insulate the table from any thermal gradient in portions of the chip beside the table. In the example of FIG. 6, first 620 and second 625 resistors are provided on the table, and while not shown in either view it will be understood that the resistors are fabricated in a stack arrangement such as was described in FIG. 4. In this illustrated exemplary embodiment the resistors are patterned and etched such that their final configuration is a meander configuration, specifically a snake (S) configuration. It will be appreciated that the actual configuration of the resistors is not important, what is important is that the main portion of the fabricated resistor is provided on a thermally insulated table.

Each of the two resistors is provided with contact points 630, to facilitate connection of the resistors to the remaining portions of the electrical circuit (not shown).

It will be understood that in this embodiment while FIG. 6 shows the formation of a table with two resistors, that any number of resistors could be provided, and what is important is that the table provides a level of thermal isolation for the resistor(s) provided thereon. If the circuit employs additional thermally sensitive components these too could be provided on dedicated thermally isolate regions, each of which are desirably formed using MEMS fabrication techniques. In the context of a thermal radiation sensor, the provision of the resistive elements on a thermally isolated region within the substrate ensures that the output of the resistor is dependent on given input radiation flux density as opposed to thermal effects from other elements located on the substrate.

As was mentioned above heat sensitive resistors are characterized by having a known temperature coefficient of resistance (TCR), and will absorb heat from the incoming radiation if they are illuminated by it. Using a stack arrangement where the TCR parameters of the resistive elements are not degraded through the fabrication process and then having that formed stack located on a thermally isolated region serves to improve the response characteristics of the resistive element and the circuit of which it forms a part.

The construction of a table and location of the radiation sensitive element thereon ensures that the table is poorly coupled thermally while ensuring the radiation sensitive resistor response can be linked back to the quantity that it is designed to sense. Where two or more resistors are provided on a table, their environment is isothermal. It will be understood that although the thermal isolation of the table slightly degrades the use of such arrangements for high performance devices, that this can be modified by varying the aspect ratio of the table legs. The thermal conductance of the table is dominated by the aspect ratio of the table legs and thus, widening the legs to accommodate two resistors will cause a decrease in the achievable thermal resistance from the table to the substrate (the main heat sink in such systems). It will therefore be understood that as the legs affect the total DC response and the time constant of response of the sensor, that there is a certain trade-off possible where the designer of the system may choose different dimensions of legs depending on the speed of response versus accuracy required for the system While this embodiment has been described with reference to a preferred implementation where two resistive elements are provided on a thermally isolated table it will be understood that this illustration is exemplary of the type of is benefit that may be achieved using the teaching of the invention. Such teaching may be considered as providing a thermally sensitive electrical element on a first region which is thermally isolated from the remainder of the substrate. Such thermal isolation has been described with reference to the embodiment where the table is fabricated in the substrate, but it will be understood that equivalently a table could be fabricated on a substrate. Such a structure could be provided by for example, depositing a sacrificial layer on an upper surface of the substrate, then the sensor element layers, including support layers, and then removing the sacrificial layer, leaving a freestanding table. Alternative implementations where instead of the sacrificial layer, a deposited layer is provided having high thermal coefficients such that it serves to thermally isolate the formed sensor elements located thereabove from thermal effects present in the substrate. These and other modifications will be apparent to the person skilled in the art as a means to provide a thermal barrier under the electrical elements where high degrees of thermal isolation are required.

It will be appreciated that as the present invention teaches the provision of a multilayer arrangement that the words upper and lower have been used extensively within the present specification to illustrate relative positions of layers within the multi-layer structure. Such language is used for exemplary descriptive purposes and it is not intended that the invention be limited in any fashion except as may be deemed necessary in the light of the appended claims.

While the invention has been described with reference to the exemplary embodiments of FIGS. 3 to 6, it will be understood that these are provided for an understanding of the teaching of the invention and it is not intended to limit the invention in any way except as may be deemed necessary in the light of the appended claims. The person skilled in the art will understood that where integers or components are described with reference to any one embodiment that these integers or components may be interchanged for others without departing from the spirit or scope of the invention which is to be construed as limiting only insofar as is deemed necessary in the light of the appended claims.

The words comprises/comprising when used in this specification are to specify the presence of stated features, integers, steps or components but does not preclude the presence or addition of one or more other features, integers, steps, components or groups thereof.

The invention claimed is:

1. A multilayer semiconductor structure comprising:
a metal film resistive element formed as an intermediary layer within the structure, the metal film resistive element having an upper surface and a lower surface facing away from the upper surface;
a dielectric layer formed below the lower surface of the metal film resistive element;
a first barrier layer formed on the upper surface; and
a second barrier layer interposed between and contacting the dielectric layer and the metal film resistive element,
wherein the barrier material protects the resistive element from diffusion of contaminants from adjacent layers.

2. The structure as claimed in claim 1 wherein the first and second barrier layers and the resistive element define a stack within the structure, the first and second barrier layers sandwiching the resistive element therebetween, the resistive element being a third layer within the stack.

3. The structure as claimed in claim 2 wherein the depth of each of the first and second barrier layers is significantly less than the depth of the third layer.

4. The structure as claimed in claim 3 wherein the depth of each of the first and second barrier layers is an order of magnitude less than that of the third layer.

5. The structure as claimed in claim 4 wherein the depth of the third layer is of the order of hundreds of nanometers.

6. A multilayer semiconductor structure including a metal film resistive element formed as an intermediary layer within the structure, the resistive element being encapsulated within a barrier material, the barrier material protecting the resistive element from diffusion of contaminants from adjacent layers, wherein the resistive element is formed from a titanium film.

7. The structure as claimed in claim 6 wherein the barrier material is formed from titanium nitride.

8. The structure as claimed in claim 2 wherein the stack is formed using sputtering techniques.

9. The structure as claimed in claim 1 wherein the resistive metal is thermally sensitive.

10. A multilayer semiconductor structure including a metal film resistive element formed as an intermediary layer within the structure, the resistive element being encapsulated within a barrier material, the barrier material protecting the resistive element from diffusion of contaminants from adjacent layers, wherein the encapsulation of the resistive element within the barrier material defines a stack within the structure, the stack having a first and second layer formed from the barrier material, the first and second layers sandwiching the resistive element therebetween, the resistive element being a third layer within the stack, wherein the stack is provided between a first metal interconnect layer and a second metal interconnect layer.

11. A thermal sensor including a multilayer semiconductor structure including a metal film resistive element formed as an intermediary layer within the structure, the resistive element being encapsulated within a barrier material, the barrier material protecting the resistive element from diffusion of contaminants from adjacent layers.

12. A multilayer semiconductor structure including a metal film resistive element formed as an intermediary layer within the structure, the resistive element being encapsulated within a barrier material, the barrier material protecting the resistive element from diffusion of contaminants from adjacent layers, wherein the encapsulation of the resistive element within the barrier material defines a stack within the structure, the stack having a first and second layer formed from the barrier material, the first and second layers sandwiching the resistive element therebetween, the resistive element being a third layer within the stack, wherein the structure forms part of an electrical circuit fabricated on a semiconductor substrate, the resistive element being a thermally sensitive electrical element providing an output which contributes to the overall output of the circuit and wherein the structure is located on a first region of the substrate which is thermally isolated from the remainder of the substrate.

13. The structure as claimed in claim 12 wherein the first region is formed in the substrate.

14. The structure as claimed in claim 12 wherein the first region is formed on the substrate.

15. The structure as claimed in claim 12 wherein the first region is thermally isolated from the substrate by providing an evacuated cavity below the first region.

16. The structure as claimed in claim 12 wherein the first region is thermally isolated from the substrate by providing an insulating layer between the first region and the substrate below.

17. The structure as claimed in claim 12 wherein the first region is suspended relative to the substrate.

18. The structure as claimed in claim 12 wherein the first region provides a substantially isothermal structure.

19. The structure as claimed in claim 12 wherein the first region is coupled at one or more edge portions to the substrate.

20. The structure as claimed in claim 19 wherein the first region is provided as a table, the table being supported relative to the substrate by the provision of one or more legs, the leg(s) being provided at edge portions of the table.

21. A thermal sensor fabricated on a semiconductor substrate, the sensor including a resistive element provided in a stack structure, the resistive element including a metal film resistive element formed as an intermediary layer within the structure, the resistive element being encapsulated within a barrier material, the barrier material protecting the resistive element from diffusion of contaminants from adjacent layers of the stack, the resistive element providing an output which contributes to the overall output of the thermal sensor and wherein the stack structure is formed on a first region which is thermally isolated from the semiconductor substrate.

22. The structure as claimed in claim 1, further comprising another dielectric layer formed above the upper surface of the metal film resistive element, wherein the first barrier layer is interposed between and contacts the other dielectric layer and the metal film resistive element.

* * * * *